(12) United States Patent
Movchan et al.

(10) Patent No.: US 7,393,416 B2
(45) Date of Patent: Jul. 1, 2008

(54) VAPOR DEPOSITION PROCESS AND APPARATUS THEREFOR

(75) Inventors: Boris A. Movchan, Kyiv (UA); Irene Spitsberg, Loveland, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 114 days.

(21) Appl. No.: 10/709,668

(22) Filed: May 21, 2004

(65) Prior Publication Data

US 2005/0034669 A1 Feb. 17, 2005

Related U.S. Application Data

(62) Division of application No. 10/064,887, filed on Aug. 27, 2002, now Pat. No. 6,790,486.

(51) Int. Cl.
C23C 14/28 (2006.01)
C23C 14/30 (2006.01)

(52) U.S. Cl. ............... 118/688; 118/708; 118/722; 118/723 EB; 118/726

(58) Field of Classification Search ........... 118/722, 118/723 EB, 688, 708
See application file for complete search history.

(56) References Cited

U.S. PATENT DOCUMENTS

| | | | | |
|---|---|---|---|---|
| 4,676,994 A | * | 6/1987 | Demaray | ............ 427/566 |
| 5,015,492 A | * | 5/1991 | Venkatesan et al. | ............ 427/8 |
| 5,334,462 A | * | 8/1994 | Vine et al. | ............ 428/697 |
| 5,849,371 A | * | 12/1998 | Beesley | ............ 427/566 |
| 6,586,115 B2 | * | 7/2003 | Rigney et al. | ............ 428/633 |
| 6,669,989 B2 | * | 12/2003 | Movchan et al. | ............ 427/249.5 |
| 6,808,799 B2 | * | 10/2004 | Darolia et al. | ............ 428/305.5 |
| 2002/0110698 A1 | * | 8/2002 | Singh | ............ 428/472 |

* cited by examiner

*Primary Examiner*—Richard Bueker
(74) *Attorney, Agent, or Firm*—William Scott Andes; Gary M. Hartman; Domenica N.S. Hartman

(57) ABSTRACT

An apparatus for depositing a ceramic coating on a component. The apparatus includes an evaporation source containing multiple different oxide compounds, at least one of the oxide compounds having a vapor pressure that is higher than the remaining oxide compounds, to deposit on the component a coating of the multiple oxide compounds. The apparatus further includes a device for introducing the evaporation source into a coating chamber, a device for suspending the component near the evaporation source, a device for projecting a high-energy beam on the evaporation source to melt and form a vapor cloud of the oxide compounds of the evaporation source, a device capable of preventing the vapor cloud from contacting and condensing on the component, and a device for moving the preventing device to allow the vapor cloud to contact and condense on the component.

15 Claims, 4 Drawing Sheets

VAPOR DEPOSITION PROCESS AND APPARATUS THEREFOR

CROSS REFERENCE TO RELATED APPLICATIONS

This is a division patent application of U.S patent application Ser. No. 10/064,887, filed Aug. 27, 2002, now U.S. Pat. No. 6,790,486.

BACKGROUND OF INVENTION

1. Field of the Invention

The present invention generally relates to coating processes. More particularly, this invention is directed to a vapor deposition process and apparatus for depositing ceramic coatings containing multiple oxides with different vapor pressures using a single evaporation source containing the multiple oxides.

2. Description of the Related Art

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, certain components of the turbine, combustor and augmentor sections of a gas turbine engine can be required to operate at temperatures at which the mechanical properties of such alloys would be insufficient. For this reason, these components are often protected by a thermal barrier coating (TBC) formed of a ceramic material. Because of the different coefficients of thermal expansion (CTE) between ceramic materials and the superalloy substrates they protect, an oxidation-resistant bond coat is typically employed to promote adhesion and extend the service life of a TBC, as well as protect the underlying substrate from damage by oxidation and hot corrosion attack. Bond coats used on superalloy substrates are typically in the form of an overlay coating such as MCrAlX (where M is iron, cobalt and/or nickel, and X is yttrium or another rare earth element), or a diffusion aluminide coating. During the deposition of the ceramic TBC and subsequent exposures to high temperatures, such as during engine operation, these bond coats form a tightly adherent alumina ($Al_2O_3$) layer or scale that adheres the TBC to the bond coat.

Various ceramic materials have been proposed for TBC's, the most notable of which is zirconia ($ZrO_2$) that is partially or fully stabilized by yttria ($Y_2O_3$), magnesia (MgO) or another alkaline-earth metal oxides, or ceria ($CeO_2$) or another rare-earth metal oxides. Binary yttria-stabilized zirconia (YSZ) is widely used as a TBC material because of its high temperature capability, low thermal conductivity and erosion resistance in comparison to zirconia stabilized by other oxides. YSZ is also preferred as a result of the relative ease with which it can be deposited by plasma spraying, flame spraying and physical vapor deposition (PVD) techniques. TBC's employed in the highest temperature regions of gas turbine engines are often deposited by PVD, particularly electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

To reduce and stabilize the thermal conductivity of YSZ, ternary YSZ systems have been proposed. For example, commonly-assigned U.S. Pat. No. 6,586,115 to Rigney et al. discloses a TBC of YSZ alloyed to contain certain amounts of one or more alkaline-earth metal oxides (magnesia (MgO), calcia (CaO), strontia (SrO) and barium oxide (BaO)), rare-earth metal oxides (lanthana ($La_2O_3$), ceria ($CeO_2$), neodymia ($Nd_2O_3$), gadolinium oxide ($Gd_2O_3$) and dysprosia ($Dy_2O_3$)), and/or such metal oxides as nickel oxide (NiO), ferric oxide ($Fe_2O_3$), cobaltous oxide (CoO), and scandium oxide ($Sc_2O_3$). According to Rigney et al., when present in sufficient amounts these oxides are able to significantly reduce the thermal conductivity of YSZ by increasing crystallographic defects and/or lattice strains. In commonly-assigned U.S. Pat. No. 6,808,799 to Darolia et al., a TBC of YSZ is deposited to contain a third oxide, elemental carbon and potentially carbides and/or a carbon-containing gas. The resulting TBC is characterized by lower density and thermal conductivity, high temperature stability and improved mechanical properties.

To reduce and stabilize the thermal conductivity of YSZ, ternary YSZ systems have been proposed. For example, commonly-assigned U.S. patent application Ser. No. 09/833,446 to Rigney et al. discloses a TBC of YSZ alloyed to contain certain amounts of one or more alkaline-earth metal oxides (magnesia (MgO), calcia (CaO), strontia (SrO) and barium oxide (BaO)), rare-earth metal oxides (lanthana ($La_2O_3$), ceria ($CeO_2$), neodymia ($Nd_2O_3$), gadolinium oxide ($Gd_2O_3$) and dysprosia ($Dy_2O_3$)), and/or such metal oxides as nickel oxide (NiO), ferric oxide ($Fe_2O_3$), cobaltous oxide (CoO), and scandium oxide ($Sc_2O_3$). According to Rigney et al., when present in sufficient amounts these oxides are able to significantly reduce the thermal conductivity of YSZ by increasing crystallographic defects and/or lattice strains. In commonly-assigned U.S. patent application Ser. No. 10/064,785 to Darolia et al., a TBC of YSZ is deposited to contain a third oxide, elemental carbon and potentially carbides and/or a carbon-containing gas. The resulting TBC is characterized by lower density and thermal conductivity, high temperature stability and improved mechanical properties.

While the incorporation of additional oxide compounds into a YSZ TBC in accordance with Rigney et al. and Darolia et al. has made possible a more stabilized TBC microstructures, it can be difficult to deposit a TBC by an evaporation process to produce a desired and uniform composition if the additional oxide has a significantly different vapor pressure than zirconia and yttria. For example, ceria has a vapor pressure of about 10 mbar, in comparison to vapor pressures of about 0.05 mbar for zirconia and yttria at 2500° C. If a YSZ+ceria TBC is to be deposited by EBPVD or another vapor deposition process, evaporating a single ingot containing the desired YSZ+ceria composition deposits a TBC that has an unacceptable nonuniform distribution of ceria. To avoid this result, co-evaporation of oxides having vapor pressures significantly different from YSZ (e.g., at least an order of magnitude higher than YSZ) has been performed with a separate ingot of each additional oxide. If a single electron beam is used, a controlled beam jumping technique must be employed, by which the beam is briefly projected (in the millisecond range) on each ingot, with the amount of time on each ingot being adjusted so that the energy output achieves the energy balance required to obtain compositional control.

As an alternative to the use of a single beam, multiple electron guns operated at different power levels have been used to maintain molten pools of each ingot material. However, both of these techniques complicate the deposition process such that the incorporation of additional oxides in a YSZ TBC can be difficult to perform in a commercial setting.

In view of the above, it would be desirable if a process existed that simplified the co-evaporation of oxides with different vapor pressures.

SUMMARY OF INVENTION

The present invention provides a process and apparatus for depositing a ceramic coating, such as a thermal barrier coating (TBC) for a component intended for use in a hostile thermal environment, such as the superalloy turbine, combustor and augmentor components of a gas turbine engine. The process of this invention is particularly directed to an evaporation technique for depositing a TBC formed of multiple oxide compounds, at least one of which has a vapor pressure that differs from the remaining oxide compounds. An example is in the deposition of a TBC formed of YSZ alloyed with a third oxide to reduce the density and/or thermal conductivity of the TBC, improve high temperature stability, and/or improve mechanical properties.

The invention generally entails providing an evaporation source containing multiple different oxide compounds, at least one of the oxide compounds having a vapor pressure that is higher than the remaining oxide compounds. In a YSZ coating system, examples of particularly suitable oxide compounds are metal oxides of metals such as cerium, gadolinium, neodymium, lanthanum, dysprosium, ytterbium, tantalum, magnesium, calcium, strontium and barium, which have a sufficient absolute percent ion size difference relative to zirconium ions to produce significant lattice strains that promote lower thermal conductivities. The component intended to be coated is suspended near the evaporation source, and a high-energy (e.g., electron or laser) beam is projected onto the evaporation source to melt and form a vapor cloud of the oxide compounds of the evaporation source, while preventing the vapor cloud from contacting and condensing on the component during an initial phase in which the relative amount of the one oxide compound in the vapor cloud is greater than the relative amount of the oxide compound in the evaporation source. For this purpose, a barrier may be physically placed between the component and the evaporation source. During a subsequent phase, in which the relative amount of the oxide compound in the vapor cloud has decreased to something approximately equal to its relative amount in the evaporation source, the vapor cloud is allowed to contact and condense on the component to form the coating. If a barrier was used to initially prevent deposition of the coating, the barrier is removed during this subsequent phase of the evaporation process.

In view of the above, it can be appreciated that the present invention is based on a determination that, at the beginning of an evaporation process using an evaporation source (e.g., ingot) containing multiple oxide compounds including one or more whose vapor pressure is higher than the other oxide compounds, the vapor cloud is rich with the oxide compound with the highest vapor pressure, as a result of the oxide compound evaporating faster than the other oxide compounds. Furthermore, it was determined that over a period of time, the evaporation source becomes enriched in the oxide component(s) having lower vapor pressures (corresponding to lower evaporation rates), with the result that an equilibrium (or near equilibrium) is established in the evaporation process, resulting in a more uniform co-evaporation of the oxide compounds in the evaporation source. As a result, a coating deposited during this phase of the evaporation process will have a composition more nearly equal to that of the evaporation source. Accordingly, a preferred aspect of the present invention is to allow the vapor cloud evaporated from an evaporation source to contact and condense on the article primarily or exclusively during this later phase, producing a coating whose composition is more predictable and uniform than otherwise possible when using a single evaporation source for the multiple oxide compounds.

Other objects and advantages of this invention will be better appreciated from the following detailed description.

DETAILED DESCRIPTION

Figure 1:
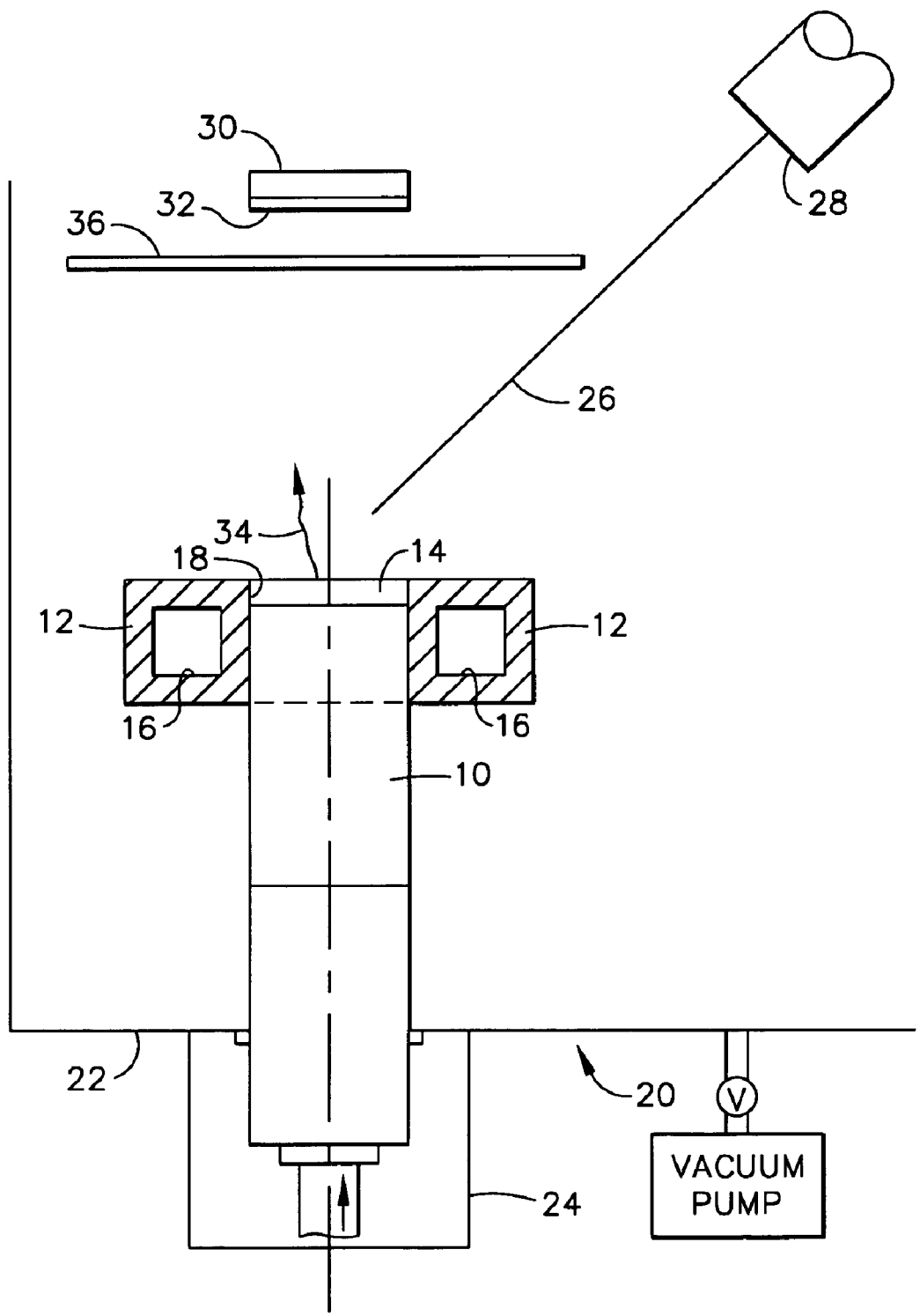
FIG. 1 is a schematic representation of an EBPVD apparatus using a single evaporation source containing multiple oxide compounds, one of which has a significantly higher vapor pressure than the remaining oxide compounds of the source in accordance with one embodiment of the present invention.

The present invention is generally applicable to components subjected to high temperatures, such as the high and low pressure turbine nozzles and blades, shrouds, combustor liners and augmentor hardware of gas turbine engines. While the advantages of this invention are particularly applicable to gas turbine engine components, the teachings of this invention are generally applicable to any component on which a TBC may be used to provide protection from a high temperature environment.

TBC's of particular interest to the invention are typically bonded to a substrate, such as a superalloy material, with a metallic bond coat deposited on the substrate. The bond coat is preferably an aluminum-rich composition, such as an overlay coating of an MCrAlX alloy or a diffusion coating such as a diffusion aluminide or a diffusion platinum aluminide of a type known in the art, though it is foreseeable that other bond coat materials and types could be used. As with prior art TBC'S, TBC's of this invention are intended to be deposited to a thickness that is sufficient to provide the required thermal protection for the particular component, typically on the order of about 75 to about 300 micrometers, though lesser and greater thicknesses are foreseeable.

According to a preferred aspect of the invention, the thermal-insulating material of the TBC 26 is based on binary yttria-stabilized zirconia (YSZ), but alloyed to contain at least a third metal oxide. The invention particularly pertains to the deposition by evaporation of YSZ-based coatings in which one or more of the additional metal oxides have a vapor pressure that differs significantly from zirconia and yttria, e.g., at least an order of magnitude. Though not a necessary feature of the invention, the third oxide preferably has the effect of reducing and/or stabilizing the thermal conductivity of the TBC 32. For this purpose, and in accordance with commonly-assigned U.S. Pat. No. 6,586,115 to Rigney et al., the third oxide preferably has an absolute percent ion size difference relative to zirconium ions of at least that of an yttrium anion ($Y^{3+}$), i.e., at least 13 percent, so as to produce significant strains due to ionic size. In accordance with commonly-assigned U.S. Pat. No. 6,808,799 to Darolia et al., the TBC 32 may be further modified to contain elemental carbon in the form of precipitate clusters, from which may evolve a carbon-containing gas (e.g., carbon monoxide (CO) and/or carbon dioxide ($CO_2$)) as a result of thermal decomposition of carbon. In combination, the presence of elemental carbon clusters and one or more of the above-specified third metal oxides is believed to reduce the density and thermal conductivity of a YSZ TBC.

According to a preferred aspect of the invention, the thermal-insulating material of the TBC 26 is based on binary yttria-stabilized zirconia (YSZ), but alloyed to contain at least a third metal oxide. The invention particularly pertains to the deposition by evaporation of YSZ-based coatings in which one or more of the additional metal oxides have a vapor pressure that differs significantly from zirconia and yttria, e.g., at least an order of magnitude. Though not a necessary feature of the invention, the third oxide preferably has the effect of reducing and/or stabilizing the thermal conductivity of the TBC 32. For this purpose, and in accordance with commonly-assigned U.S. patent application Ser. No. 09/833, 446 to Rigney et al., the third oxide preferably has an absolute percent ion size difference relative to zirconium ions of at least that of an yttrium anion ($Y^{3+}$), i.e., at least 13 percent, so as to produce significant strains due to ionic size. In accordance with commonly-assigned U.S. patent application Ser. No. 10/064,785 to Darolia et al., the TBC 32 may be further modified to contain elemental carbon in the form of precipitate clusters, from which may evolve a carbon-containing gas (e.g., carbon monoxide (CO) and/or carbon dioxide ($CO_2$)) as a result of thermal decomposition of carbon. In combination, the presence of elemental carbon clusters and one or more of the above-specified third metal oxides is believed to reduce the density and thermal conductivity of a YSZ TBC.

The TBC 32 preferred for this invention preferably contains about 3 to about 8 weight percent yttria, though lesser or greater amounts of yttria could be used. Examples of suitable oxide compounds to be alloyed with YSZ are metal oxides such as cerium, gadolinium, neodymium, lanthanum, dysprosium, ytterbium, tantalum, magnesium, calcium, strontium and barium, which have vapor pressures that differ significantly from zirconia and yttria. For example, ceria, neodymia, lanthana, ytterbia, magnesia, strontia and barium oxide are all believed to have vapor pressures higher than zirconia and yttria, some more than an order of magnitude higher. Based on the teachings of Rigney et al. and Darolia et al., ceria in amounts of about 10 to about 20 weight percent of the TBC 32 is believed to be particularly beneficial, though it is foreseeable that lower and higher levels of ceria could be used.

Figure 2:
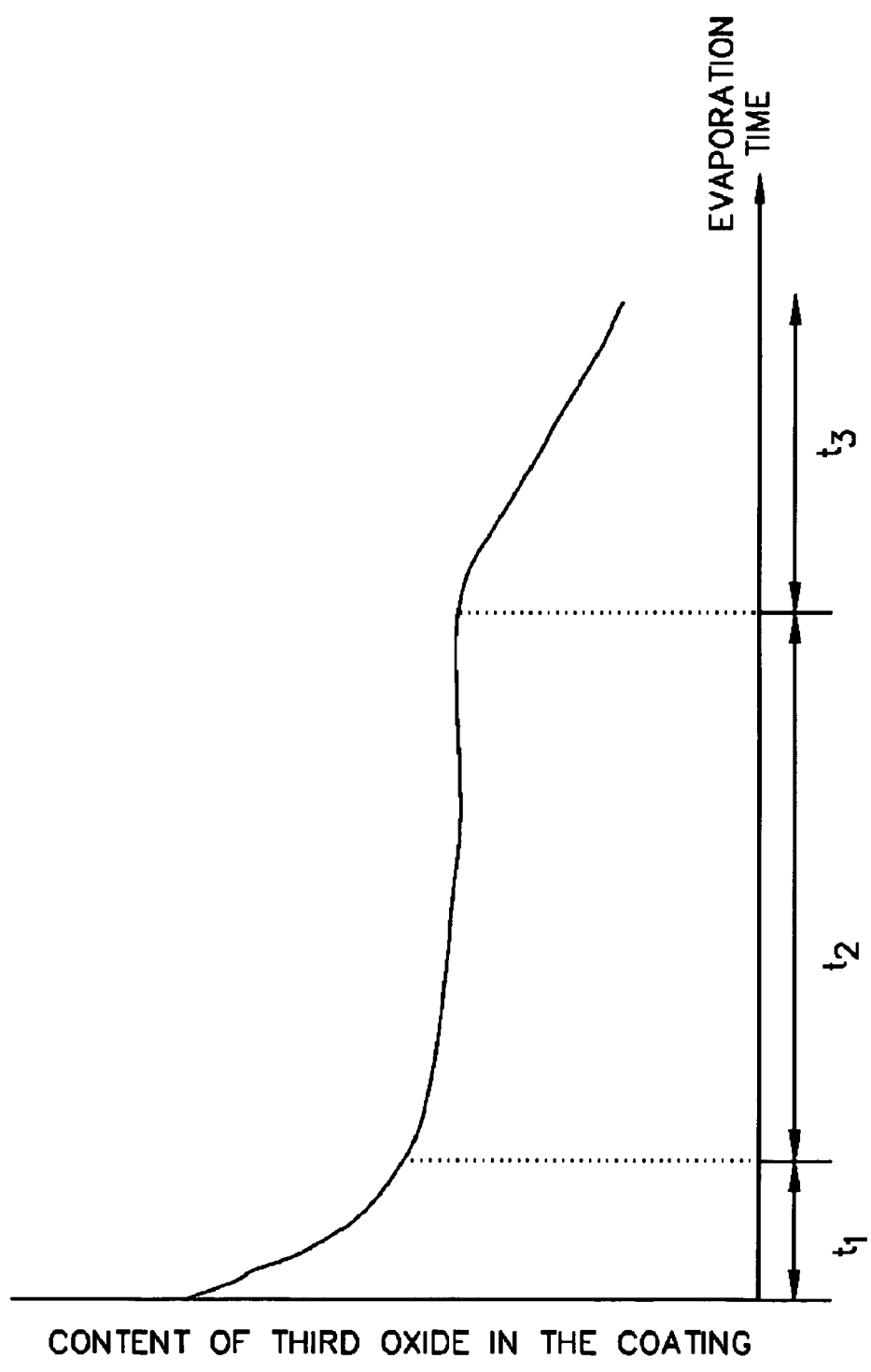
FIG. 2 is a graph representing the concentration in a coating of the oxide compound with the higher vapor pressure, plotted relative to time during the coating process.

According to the present invention, YSZ and ceria (or another high vapor pressure oxide) are simultaneously evaporated from a single ingot 10 having the desired composition for the coating 32, even though prior art attempts to co-evaporate YSZ and ceria have produced coatings whose compositions are not uniform or consistent with the composition of the ingot as a result of the higher vapor pressure of ceria. In an investigation leading to this invention, an ingot containing YSZ alloyed with about 16 weight percent ceria was evaporated by EBPVD to deposit a TBC. With reference to FIG. 2, analysis of the coating indicated that the portion of the TBC deposited at the beginning of the evaporation process ($t_1$) was rich in ceria. The ceria content dropped through the initial thickness of the TBC, corresponding to a coating duration of about ten minutes, after which the ceria content was relatively stable within the coating ($t_2$) before dropping off near the end of the coating operation ($t_3$). From this investigation, it was concluded that the vapor cloud 34 within the coating chamber is initially rich in ceria ions as a result of the higher vapor pressure of ceria (corresponding to a higher evaporation rate). However, after a period of time ($t_1$) an equilibrium (or near equilibrium) appeared to become established in the evaporation process, resulting in a more uniform co-evaporation of YSZ and ceria from the ingot. While not wishing to be held to any particular theory, it was concluded that the ingot had become sufficiently enriched in YSZ as a result of the lower evaporation rates of yttria and zirconia (resulting from their relatively lower vapor pressures), that the apparent equilibrium was established for the evaporation rates of zirconia, yttria and ceria. The final drop-off of the ceria content in the coating ($t_3$) was attributed to the remainder of the ingot being rich in YSZ from the earlier accelerated lose of ceria without any additional ceria available from the bulk of the ingot.

On this basis, it was concluded that a TBC 32 deposited during the intermediate phase ($t_2$) of the evaporation process can have a composition more nearly equal to that of the ingot. Accordingly, an object of the invention is to allow the vapor cloud 34 evaporated from the ingot 10 to contact and condense on the component 30 primarily or exclusively during this intermediate phase, to produce a TBC 32 whose composition is more predictable and uniform than otherwise possible when using a single evaporation source. With reference again to FIG. 1, the EBPVD apparatus 20 is depicted as including a barrier 36 that is shown to be positioned between the component 30 and the molten pool 14, representative of the initial or latter phases of the coating process in which the proportional composition of the vapor cloud 34 differs from the ingot 10. A suitable barrier 36 is a stainless steel plate that can be maneuvered from outside the coating chamber 22. One approach to using the barrier 36 is to determine the $t_1"$ and $t_2"$ time periods for a given ingot composition, and then programming the apparatus 20 to withdraw the barrier 36 at $t_1$ following startup of the coating process. The barrier 36 can be later reinserted or the evaporation process simply terminated at the end of $t_2$ before evaporation occurs of the YSZ-rich remainder of the ingot 10. Alternatively, the operation of the apparatus could be automated based on sensing the chemistry of the vapor cloud 34.

While the use of a physical barrier 36 is a particularly effective technique for limiting deposition to the intermediate phase ($t_2$) of the coating process, other techniques are possible. For example, deposition of a coating rich in the higher vapor pressure constituent(s) of the ingot 10 can be avoided by performing the initial phase ($t_1$) of the coating process as a separate run, during which the component 30 has not yet been placed in the chamber 22. Deposition of a coating rich in the lower vapor pressure constituent(s) of the ingot 10 can be avoided by terminating the coating process prior to entering the final phase ($t_3$), i.e., before evaporation occurs of the final portion of the ingot 10 that is rich in the lower vapor pressure constituent(s). Furthermore, the latter phase ($t_3$) of the coating process can be effectively postponed as long as ingot material is continuously fed into the chamber 22.

Figure 3:
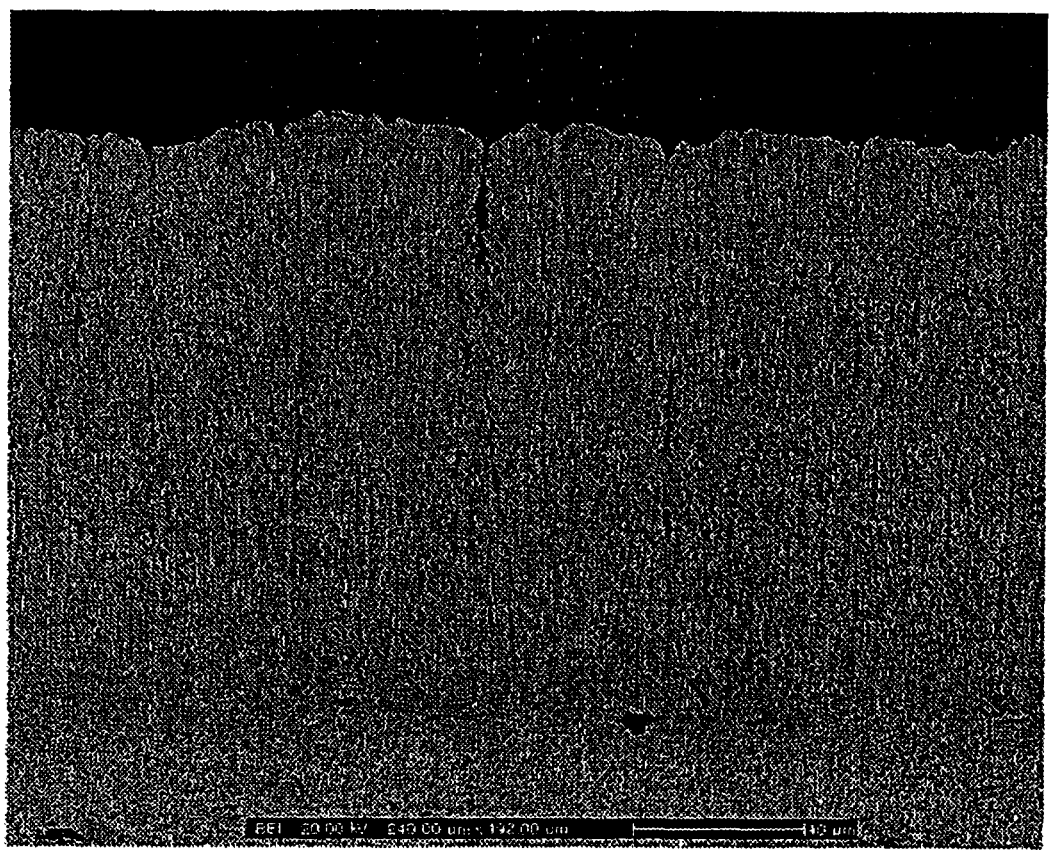
FIG. 3 is a microphotograph of a cross-section through a thermal barrier coating deposited in accordance with the present invention.
Figure 4:
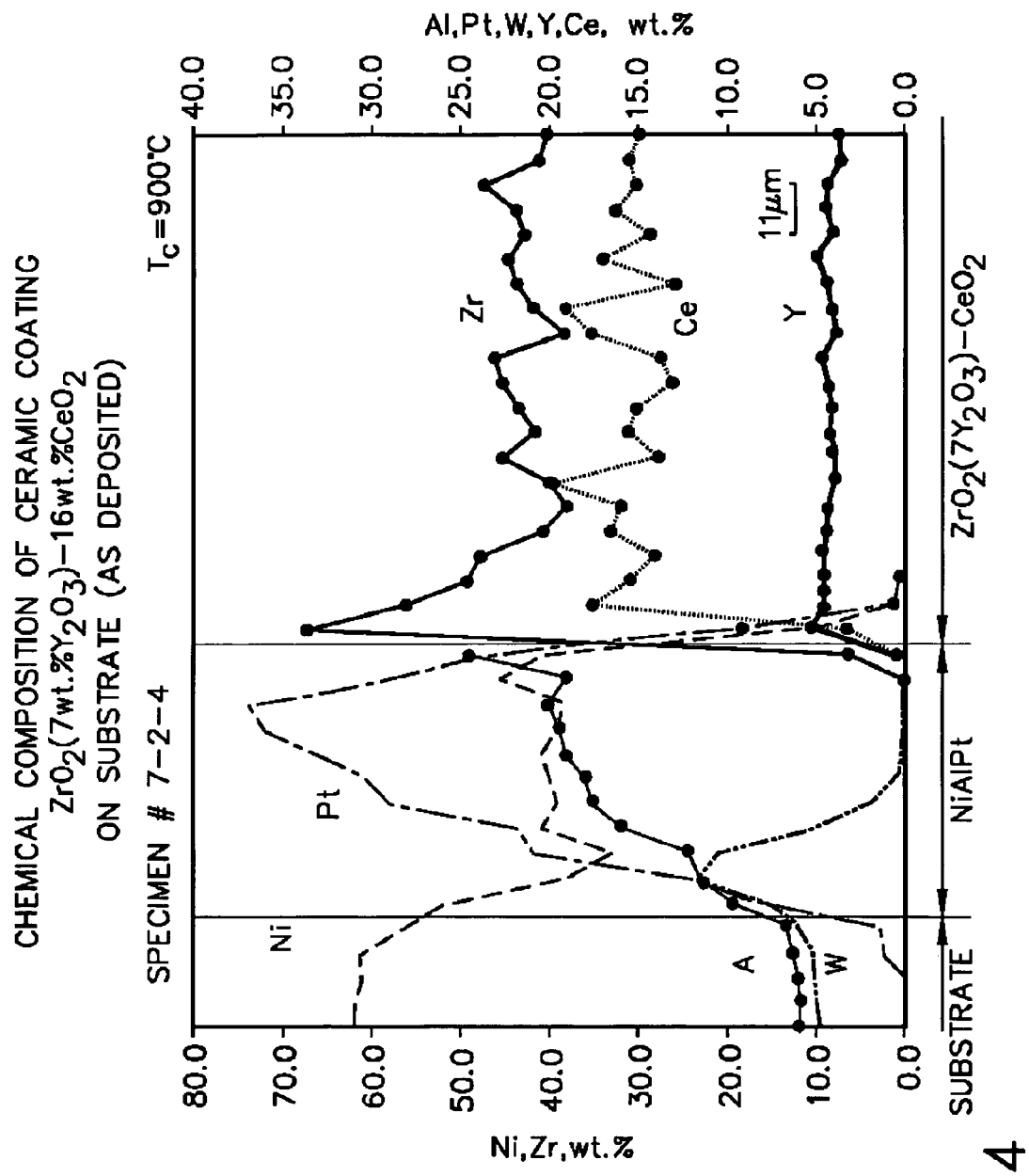
FIG. 4 is a graph of the chemical composition of a thermal barrier coating deposited in accordance with the present invention.

In a second investigation leading to this invention, TBC's were deposited by EBPVD on specimens formed of the superalloy René N5 on which a platinum aluminide (PtAl) diffusion bond coat had been deposited. The specimens were coated by evaporating an ingot of zirconia stabilized by about seven weight percent yttria (7%YSZ) alloyed with about 16 weight percent ceria. The specimens were loaded into a coating chamber so as to be supported above the ingot, and the chamber evacuated to achieve a partial vacuum of about $10^{-4}$ Torr (about $1.3 \times 10^{-4}$ mbar). The specimens were then heated to a temperature of about 900° C. While rotating the specimens at a rate of about 25 rpm, the ingot was evaporated using an electron beam gun operated at a constant power level of about 24.5 kW. During an initial period of about 10 minutes, the vapor cloud produced by the evaporation process was prevented from contacting and condensing on the component with a barrier of the type represented in FIG. 1. Coating was then permitted for a duration of about 40 minutes by removing the barrier, after which the barrier was reintroduced to again prevent deposition on the specimens. A TBC deposited under these conditions is shown in FIG. 3 to have a desirable columnar microstructure, while FIG. 4 evidences that the elemental distribution throughout the thickness of the TBC was substantially uniform. FIG. 4 shows that, relative to their stabilized levels in the bulk of the TBC, the zirconium level was relatively high and the cerium level relatively low in the first several micrometers of the TBC. The cause of this variance is not understood, and in any event would not have a detrimental effect on the desired properties for the TBC.

While the invention has been described in terms of a preferred embodiment, it is apparent that other forms could be adopted by one skilled in the art. For example, instead of depositing the TBC by EBPVD, other vapor deposition processes could be used. Accordingly, the scope of the invention is to be limited only by the following claims.

The invention claimed is:

1. An apparatus for depositing a ceramic coating on a surface of a component, the apparatus comprising:
    a single evaporation source containing multiple different oxide compounds consisting essentially of yttria, zirconia, and at least one oxide compound having a vapor pressure that is higher than the remaining oxide compounds;
    means for introducing the evaporation source into a coating chamber;
    means for suspending the component near the evaporation source;
    means for projecting a high-energy beam on the evaporation source to melt and form a vapor cloud having a composition comprising the oxide compounds of the evaporation source;
    means for determining a first time period during which the composition of the vapor cloud is such that the relative amount of the at least one oxide compound in the vapor cloud is greater than the relative amount of the at least one oxide compound in the evaporation source and for determining a second time period that immediately follows the first time period and during which the composition of the vapor cloud is such that the relative amount of the at least one oxide compound in the vapor cloud is approximately equal to the relative amount of the at least one oxide compound in the evaporation source;
    means for preventing the vapor cloud from contacting and condensing on the component during the first time period; and
    means for removing the preventing means at the end of the first time period to allow the vapor cloud to contact and condense on the component to form the coating.

2. An apparatus according to claim 1, wherein the preventing means is a barrier positioned between the component and the evaporation source, and the removing means is operable to remove the barrier from between the component and the evaporation source.

3. An apparatus according to claim 1, wherein the evaporation source contains about 10 to about 20 weight percent ceria, the balance essentially zirconia stabilized by about 3 to about 8 weight percent yttria.

4. An apparatus according to claim 1, wherein the removing means comprises programmable means for automatically removing the preventing means following the first time period, and the programmable means comprises means for sensing the composition of the vapor cloud.

5. An apparatus according to claim 1, wherein the removing means is operable to position the preventing means between the evaporation source and the component following the second time period and during a subsequent time period in which a remaining portion of the evaporation source is relatively rich in the remaining oxide compounds.

6. An EBPVD apparatus for depositing a ceramic coating on a surface of a component, the apparatus comprising:
    a single ingot containing yttria-stabilized zirconia and at least one oxide compound having a vapor pressure that is at least an order of magnitude higher than yttria and zirconia;
    means for introducing the ingot into a coating chamber;
    means for suspending the component near the ingot;
    means for projecting an electron beam on the ingot to melt and form a vapor cloud containing ions of yttria, zirconia and the oxide compound;
    means for determining a first time period in which the composition of the vapor cloud is such that the relative amount of the at least one oxide compound in the vapor cloud is greater than the relative amount of the at least one oxide compound in the ingot and for determining a second time period that immediately follows the first time period and in which the composition of the vapor cloud is such that the relative amount of the at least one oxide compound in the vapor cloud is approximately equal to the relative amount of the at least one oxide compound in the ingot;
    a barrier operable to be positioned between the ingot and the component to prevent the vapor cloud from contacting and condensing on the component during the first time period; and
    means for removing the barrier at the end of the first time period to allow the vapor cloud to contact and condense on the component to form the coating.

7. An EBPVD apparatus according to claim 6, wherein the at least one oxide compound is selected from the group consisting of ceria, magnesia, strontia, barium oxide, lanthana, neodymia, dysprosia, and ytterbia.

8. An EBPVD apparatus according to claim 7, wherein the ingot consists essentially of yttria, zirconia, and the at least one oxide compound.

9. An EBPVD apparatus according to claim 7, wherein the ingot consists of yttria, zirconia, and the at least one oxide compound.

10. An EBPVD apparatus according to claim 9, wherein the at least one oxide compound is ceria.

11. An EBPVD apparatus according to claim 6, wherein the ingot consists of yttria, zirconia, and the at least one oxide compound.

12. An EBPVD apparatus according to claim 6, wherein the ingot contains about 10 to about 20 weight percent ceria, the balance essentially zirconia stabilized by about 3 to about 8 weight percent yttria.

13. An EBPVD apparatus according to claim 6, wherein the removing means comprises programmable means for automatically removing the barrier following the first time period.

14. An EBPVD apparatus according to claim 13, wherein the programmable means comprises means for sensing the chemistry of the vapor cloud.

15. An EBPVD apparatus according to claim 6, wherein the removing means is operable to reposition the barrier between the ingot and the component following the second time period and during a subsequent time period in which a remaining portion of the ingot is relatively rich in yttria-stabilized zirconia.

* * * * *